United States Patent [19]
LaCourse et al.

[11] Patent Number: 5,228,050
[45] Date of Patent: Jul. 13, 1993

[54] INTEGRATED MULTIPLE-WAVELENGTH LASER ARRAY

[75] Inventors: Joanne LaCourse, Hudson; Robert B. Lauer, Stow, both of Mass.

[73] Assignee: GTE Laboratories Incorporated, Waltham, Mass.

[21] Appl. No.: 830,158

[22] Filed: Feb. 3, 1992

[51] Int. Cl.$^5$ .............................................. H01S 3/19
[52] U.S. Cl. ...................................... 372/50; 372/23; 372/97
[58] Field of Search .............................. 372/50, 23, 97

[56] References Cited

U.S. PATENT DOCUMENTS

| | | | |
|---|---|---|---|
| 4,727,557 | 2/1988 | Burnham et al. | 372/50 |
| 4,947,401 | 8/1990 | Hinata et al. | 372/50 |
| 4,971,415 | 11/1990 | Hara et al. | 372/50 |

FOREIGN PATENT DOCUMENTS 0199586  11/1983  Japan ...................................... 372/50

OTHER PUBLICATIONS

Chang–Hasnain et al., "Surface Emitting Laser Arrays ... Wavelengths," Conf. Digest of the 12th IEEE Intl. Semi. Laser Conf., Davos, Switzerland pp. 18–19 (1990).

Z. L. Liau et al., "Surface-emitting GaInAsP/InP ... efficiency," Appl. Phys. Lett., vol. 46, pp. 115–117, Jan. 15, 1985.

J. N. Walpole et al., "Monolithic two-dimensional arrays ... lasers," Appl. Phys. Lett., vol. 48, pp. 1636–1638, Jun. 16, 1986.

U. Koren et al., "Wavelength division multiplexing light . . . amplifiers," Appl. Phys. Lett., 54, pp. 2056–2058 (1989).

*Primary Examiner*—Georgia Y. Epps
*Attorney, Agent, or Firm*—Victor F. Lohmann, III

[57] ABSTRACT

A monolithically integrated multiple-wavelength laser structure includes an array of lasing structures each having a cavity length chosen to correspond to a desired lasing wavelength. The array is suitable for use as a transmitter in a wavelength division multiplexing communication system. The lasing structures preferably include quantum well active regions.

11 Claims, 2 Drawing Sheets

INTEGRATED MULTIPLE-WAVELENGTH LASER ARRAY

FIELD OF THE INVENTION

This invention relates to semiconductor lasers and, more particularly, to an array of multiple wavelength lasers.

BACKGROUND OF THE INVENTION

The fabrication and integration of multiple-wavelength semiconductor laser arrays is an integral part of the development of wavelength-multiplexed communication systems. A characteristic of such systems is that the system bandwidth increases proportionally to the number of multiplexed wavelengths, each of which can carry independent signals.

One current technique for developing devices suitable for these systems involves the fabrication of discrete sources having different wavelengths by varying the composition of the active layer of each laser source. For example, by varying the indium concentration of InGaAsP active layers, the wavelength can be varied from 1.3 $\mu$m to 1.55 $\mu$m. This technique, however, is limited by the difficulty in closely spacing the wavelengths (channels), and by the difficulty in integrating such sources into an array.

Additionally, discrete or integrated multiple laser arrays can be fabricated using internal gratings to make distributed feedback (DFB) or distributed Bragg reflector (DBR) lasers. Two techniques can be used: a) varying the grating periodicity from laser to laser, which is difficult to achieve with holographically defined gratings; and b) making wavelength-tunable (multiple-section) lasers. Such an integrated array has been demonstrated by Koren et al. in "Wavelength division multiplexing light source with integrated quantum well tunable lasers and optical amplifiers," Appl. Phys. Lett. 54, pp. 2056-2058 (1989).

A multiple-wavelength array based on surface-emitting, short-wavelength (about 1 $\mu$m) lasers was recently reported by Chang-Hasnain et al. in "Surface Emitting Laser Arrays with Uniformly Separated Wavelengths," Conf. Digest of the 12th IEEE Intl. Semi. Laser Conf., Davos Switzerland, pp. 18-19 (1990). However, the wavelength of this array is inappropriate for most communication systems, and cannot be easily extended to the preferred wavelength range of 1.3 to 1.55 $\mu$m. Moreover, the fabrication complexity of such an array limits its yield, reliability, and practicality.

OBJECTS OF THE INVENTION

Accordingly, it is an object of the present invention to obviate the above-noted and other disadvantages of the prior art.

It is a further object of the present invention to fabricate an integrated array of lasers capable of lasing at multiple wavelengths.

It is a further object of the present invention to provide a device suitable for operation as a multichannel transmitter in a wavelength division multiplexed communication system.

SUMMARY OF THE INVENTION

The present invention is directed to a semiconductor structure, comprising a plurality of monolithically integrated semiconductor lasers, wherein each laser has a cavity length corresponding to a desired lasing wavelength.

In another aspect of the present invention, a transmitter in a wavelength division multiplexing communication system comprises a plurality of monolithically integrated semiconductor lasing structures. Each lasing structure is a Fabry-Perot laser having a cavity length corresponding to a desired lasing wavelength.

DETAILED DESCRIPTION OF THE PREFERRED EMBODIMENTS

The present invention is directed to a monolithically integrated array of lasing structures each having a cavity length chosen to correspond to a desired lasing wavelength. For purposes of illustrating the present invention, FIG. 1 shows an exemplary monolithic array of four laser structures with varying cavity lengths $L_1$ through $L_4$ corresponding to respective lasing wavelengths.

Figure 1:
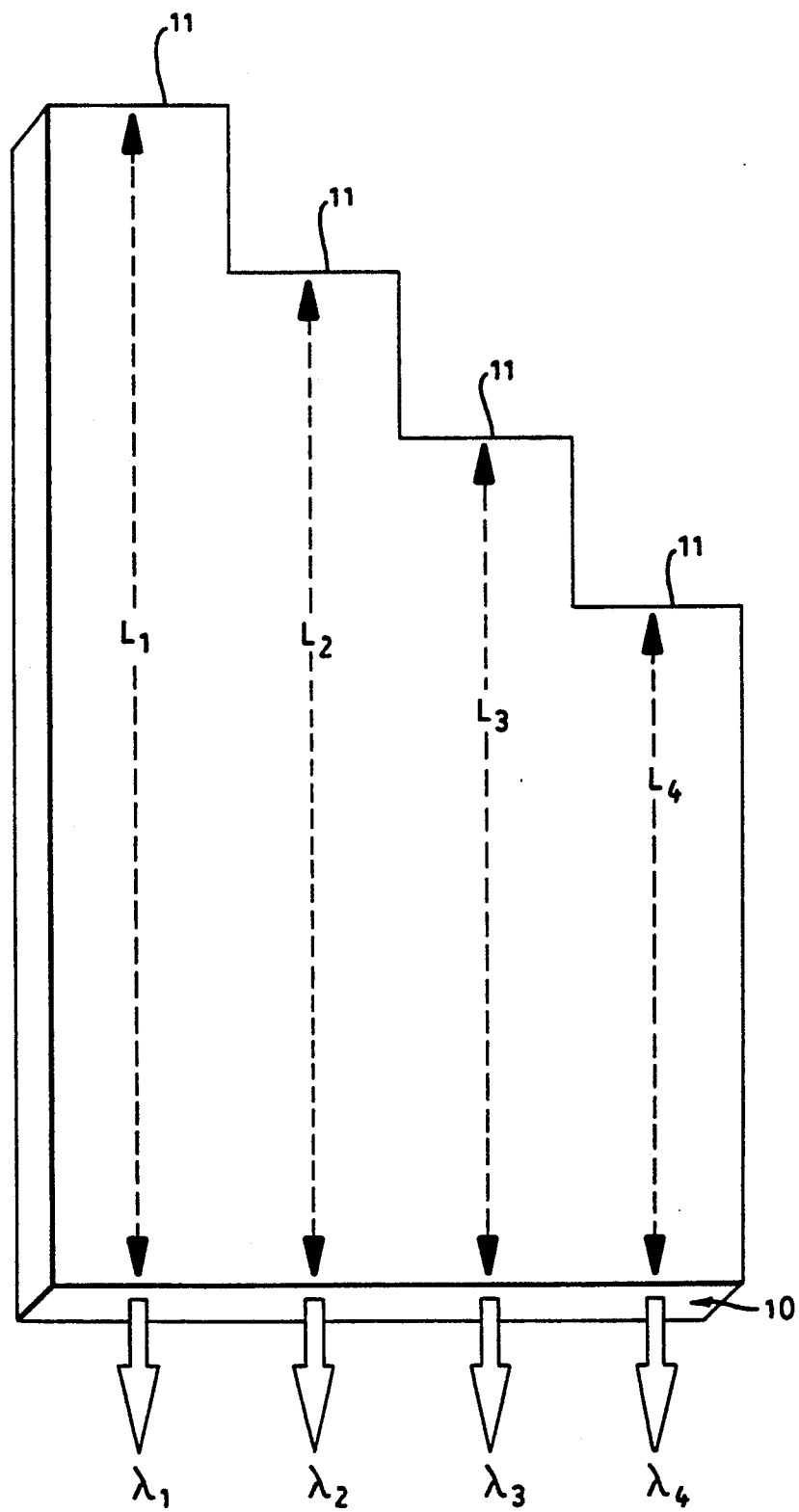
FIG. 1 shows an exemplary laser array structure in accordance with the present invention.

As shown in FIG. 1, the structure includes an array of four lasers each having a front facet 10 common with the other lasers, and a respective rear facet forming a group of rear facets 11. Conventional cleaving techniques may be used in forming the front facet 10, while high-quality rear facets are fabricated with etching techniques such as those disclosed by Van Gurp et al. in "Dry Etching of InP applied to laser devices," Philips J. Res. 44, pp. 211-239 (1989), by Matsui et al. in "GaInAsP/InP lasers with etched mirrors by reactive ion etching using a mixture of ethane and hydrogen," Appl. Phys. Lett. 54, pp. 1193-1194 (1989), and by Bouadma et al. in "Fabrication and Characteristics of Ion Beam Etched Cavity InP/InGaAsP BH Lasers," pp. 909-914 (1987). These articles to Van Gurp et al., Matsui et al., and Bouadma et al. are hereby incorporated by reference into this application.

The facets may also be formed using regrowth techniques as discussed by Liau et al. in "Surface emitting GaInAsP/InP laser with low threshold current and high efficiency," Appl. Phys. Lett., vol. 46, pp. 115-117 (1985), and by Walpole et al. in "Monolithic two-dimensional arrays of high power GaInAsP/InP surface-emitting lasers," Appl. Phys. Lett., vol. 48, pp. 1636-1638 (1986). Each of the lasing structures is electrically isolated from the other structures, wherein a respective wire bond configuration is formed with each laser structure.

Each of the lasers in FIG. 1 has a different cavity length, resulting in a different lasing wavelength. This dependence of lasing wavelength on cavity length is due to the physical effect known as bandfilling, which causes a shift in lasing to shorter wavelengths at higher carrier densities. Although semiconductor laser structures generally exhibit such wavelength dependence on cavity length, the dependence is stronger in quantum well lasers.

Specifically, this strong dependence arises from the small percentage of light confined to the active layer of quantum well lasers compared to bulk lasers. Since gain occurs only for the light in the active layer, a larger increase in threshold carrier density is required to provide the same increase in gain as in a bulk laser. Decreasing the cavity length of a quantum well laser causes a larger change in threshold carrier density, and thus lasing wavelength, compared to conventional bulk active layers.

Figure 2:
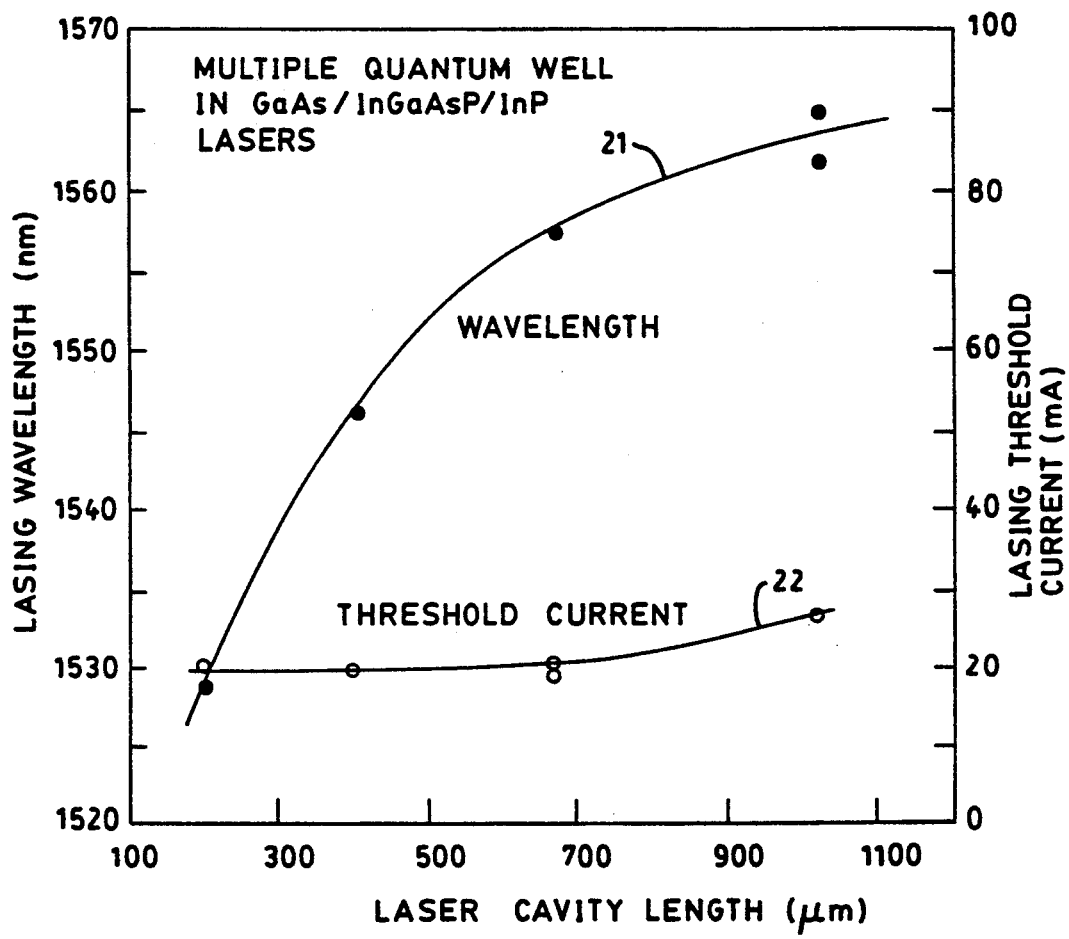
FIG. 2 graphically demonstrates the relationship between cavity length and lasing wavelength for laser structures.

FIG. 2 (curve 21) shows the observed wavelength change versus cavity length for InGaAs/InGaAsP/InP multiple quantum well Fabry-Perot lasers having five InGaAs wells. Similar behavior has also been observed for quantum well lasers with other different compositions and numbers of wells. Curve 22 represents the variation in threshold current as a function of cavity length, revealing that the threshold current is practically independent of length.

FIG. 1 is shown for illustrative purposes only, and should not serve as a limitation of the present invention. Accordingly, it should be obvious to those skilled in the art that the monolithically integrated multiple-wavelength array structure of the present invention may include any number of laser structures with an unlimited number of possible cavity lengths.

Moreover, variations in composition, layer thickness, and cavity length provide the designer with a degree of flexibility in selecting the wavelength range of the monolithically integrated laser array. For example, the InGaAs/InGaAsP/InP multiple quantum well structure used in connection with FIG. 2 is suitable for the 1.3 to 1.55 micron range, a highly useful range for fiber optic communications. Advantageously, this lasing range is possible with a minimal change in threshold current from laser to laser, as curve 22 demonstrates. Additionally, an InGaAs/GaAs/AlGaAs multiple quantum well array structure may be fabricated for the range around 980 nm.

The wavelength spacing between adjacent lasers can be easily controlled by carefully selecting the range of cavity lengths, which can be controlled to within a few microns using the photolithographic and etching techniques disclosed by Van Gurp et al., Matsui et al., and Bouadma et al. The wavelength spacing will likely be limited on the low end to a few nanometers by the wavelength width of Fabry-Perot lasers, or by the wavelength discrimination of available wavelength-multiplexing components.

The array structure of the present invention is particularly advantageous as a transmitter device in a WDM communication system. In accordance with techniques known in the art, individual information channels may be impressed on the lasing wavelengths of each of the lasers in the monolithically integrated array. For example, the wire bond of each laser structure may be driven with a respective data channel. Suitable components coupled to the array will then multiplex the emitted signals, thereby producing a WDM composite spectrum. For example, a lens may be used to focus the separate wavelength channels into a single fiber, or individual fibers may be used to couple the channels into appropriate optical combiners for multiplexing.

The number of laser structures in an array for such a WDM application may be limited by the achievable wavelength range and the minimum channel spacing. For purposes of illustration, the array structure used in connection with FIG. 1 indicates that the wavelength range can exceed 30 nm for practical lengths; thus, a 6 wavelength array can thus be made with a wavelength separation of 5 nm. The number of laser structures in the array may also be limited by system considerations, heat dissipation, practical fiber-coupling techniques, and the wavelength dependence of other components used in the system.

While there have been shown and described what are at present considered the preferred embodiment of the invention, it will be apparent to those skilled in the art that various changes, alterations and modifications may be made therein without departing from the scope of the invention as defined by the appended claims.

What is claimed is:

1. A semiconductor structure, comprising:
   a plurality of optically independent, monolithically integrated semiconductor lasers;
   wherein each laser has a cavity length corresponding to a desired lasing wavelength.

2. The structure as recited in claim 1 wherein:
   each of said lasers is a Fabry-Perot laser.

3. The structure as recited in claim 2 wherein each Fabry-Perot laser includes:
   a quantum well active region.

4. The structure as recited in claim 3 wherein each quantum well active region includes:
   a multiple quantum well structure.

5. The structure as recited in claim 4 wherein each multiple quantum well structure includes:
   InGaAs quantum well layers alternating with InGaAsP barrier layers.

6. The structure as recited in claim 3 wherein each quantum well active region includes:
   a single quantum well structure.

7. A multiple-wavelength laser array, comprising:
   a plurality of optically independent, monolithically integrated semiconductor lasing structures;
   wherein each lasing structure is a Fabry-Perot laser having a quantum well active region, and having a cavity length corresponding to a desired lasing wavelength.

8. A transmitter in a wavelength division multiplexing communication system, comprising:
   a plurality of optically independent, monolithically integrated semiconductor lasing structures;
   wherein each lasing structure is a Fabry-Perot laser having a cavity length corresponding to a desired lasing wavelength.

9. The transmitter as recited in claim 8 wherein each lasing structure includes:
   a quantum well active region.

10. The transmitter as recited in claim 9 wherein each quantum well active region includes:
    a multiple quantum well structure.

11. The transmitter as recited in claim 9 wherein each quantum well active region includes:
    a single quantum well structure.

* * * * *